United States Patent
Lee et al.

(10) Patent No.: US 12,255,139 B2
(45) Date of Patent: Mar. 18, 2025

(54) SEMICONDUCTOR DEVICES

(71) Applicant: Samsung Electronics Co., Ltd., Suwon-si (KR)

(72) Inventors: Anthony Dongick Lee, Hwaseong-si (KR); Sangcheol Na, Seoul (KR); Kichul Park, Suwon-si (KR); Sungyup Jung, Seoul (KR); Youngwoo Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 400 days.

(21) Appl. No.: 17/751,819

(22) Filed: May 24, 2022

(65) Prior Publication Data

US 2023/0065281 A1    Mar. 2, 2023

(30) Foreign Application Priority Data

Sep. 1, 2021  (KR) .................. 10-2021-0116472

(51) Int. Cl.
*H01L 23/528* (2006.01)
*H01L 21/768* (2006.01)
*H01L 23/522* (2006.01)
*H01L 23/532* (2006.01)

(52) U.S. Cl.
CPC ...... *H01L 23/528* (2013.01); *H01L 21/76832* (2013.01); *H01L 23/5226* (2013.01); *H01L 23/5283* (2013.01); *H01L 23/53295* (2013.01)

(58) Field of Classification Search
CPC  H01L 23/528; H01L 23/5283; H01L 23/5226
See application file for complete search history.

(56) References Cited

U.S. PATENT DOCUMENTS

| | | | |
|---|---|---|---|
| 9,524,935 B2 | 12/2016 | Rullan et al. | |
| 9,583,419 B2* | 2/2017 | Wood | H01L 23/481 |
| 9,865,544 B2 | 1/2018 | Jung | |
| 10,020,224 B2* | 7/2018 | Anderson | H01L 21/7681 |
| 11,189,525 B2* | 11/2021 | Wang | H01L 21/76808 |
| 2001/0027008 A1 | 10/2001 | Matsumoto | |
| 2003/0203619 A1 | 10/2003 | Abe | |

(Continued)

FOREIGN PATENT DOCUMENTS

| | | | |
|---|---|---|---|
| JP | 3536104 B2 | 6/2004 | |
| JP | 3595771 B2 | 12/2004 | |

*Primary Examiner* — David A Zarneke
(74) *Attorney, Agent, or Firm* — Harness, Dickey & Pierce, P.L.C.

(57) ABSTRACT

A semiconductor device including a first insulating structure on a substrate and including a first etch stop layer and a first interlayer insulating layer on the first etch stop layer, a second insulating structure on the first insulating structure and including a second etch stop layer and a second interlayer insulating layer on the second etch stop layer, a conductive line penetrating through the second insulating structure, and extending in a first direction parallel to an upper surface of the substrate, and a plurality of contacts penetrating through the first insulating structure and connected to the conductive line may be provided. The conductive line may include a protrusion extending below the second insulating structure and penetrating through the first interlayer insulating layer to be in contact with the first etch stop layer.

20 Claims, 16 Drawing Sheets

(56) References Cited

U.S. PATENT DOCUMENTS

| | | | |
|---|---|---|---|
| 2016/0111371 A1* | 4/2016 | Peng | H01L 21/76807 |
| | | | 438/653 |
| 2016/0343708 A1* | 11/2016 | Park | H01L 21/76895 |
| 2020/0006112 A1 | 1/2020 | Licausi et al. | |
| 2020/0006224 A1* | 1/2020 | Wang | H01L 21/76802 |
| 2020/0105660 A1 | 4/2020 | Sio et al. | |
| 2020/0135578 A1 | 4/2020 | Ching et al. | |
| 2021/0159174 A1* | 5/2021 | Lee | H01L 23/5226 |
| 2022/0045003 A1* | 2/2022 | Bae | H01L 21/76897 |

\* cited by examiner

SEMICONDUCTOR DEVICES

CROSS-REFERENCE TO RELATED APPLICATION

This application claims benefit of priority to Korean Patent Application No. 10-2021-0116472 filed on Sep. 1, 2021 in the Korean Intellectual Property Office, the disclosure of which is incorporated herein by reference in its entirety.

BACKGROUND

The present inventive concepts relate to semiconductor devices.

As demand for high performance, high speed and/or multifunctionality in semiconductor devices, or the like, is increased, a degree of integration of semiconductor devices is increasing. According to a trend for high integration of semiconductor devices, a size of a transistor may be reduced, and a size of wiring layers and contacts electrically connected to a reduced size of the transistor are also reduced. Accordingly, various studies are being conducted for stable connection of wiring layers and contacts.

SUMMARY

An aspect of the present inventive concepts is to provide a semiconductor device having improved electrical characteristics and reliability.

According to an aspect of the present inventive concepts, a semiconductor device may include a first insulating structure on a substrate, the first insulating structure including a first etch stop layer and a first interlayer insulating layer on the first etch stop layer, a second insulating structure on the first insulating structure, the second insulating structure including a second etch stop layer and a second interlayer insulating layer on the second etch stop layer, a conductive line penetrating through the second insulating structure, and extending in a first direction parallel to an upper surface of the substrate, and a plurality of contacts penetrating through the first insulating structure, and connected to the conductive line, wherein the conductive line includes a protrusion extending further downwardly than the second insulating structure, the protrusion penetrating through the first interlayer insulating layer and being in contact with the first etch stop layer, wherein a level of a lower surface of the protrusion is higher than a level of a lower surface of the plurality of contacts, and wherein the protrusion includes a first region having a first width and a second region having a second width, in a second direction perpendicular to the first direction, the second width being narrower than the first width.

According to an aspect of the present inventive concepts, a semiconductor device may include a conductive line on a substrate, the conductive line extending in a first direction parallel to an upper surface of the substrate, an insulating structure between the substrate and the conductive line, the insulating structure including a plurality of insulating layers, and a plurality of contacts penetrating through the insulating structure, the contacts connected to the conductive line, wherein plurality of insulating layers include a first insulating layer and a second insulating layer under the first insulating layer, the first insulating layer being in contact with the conductive line and including a recess portion for exposing an upper surface of the second insulating layer, wherein the conductive line includes a first portion on an upper surface of the first insulating layer and a second portion on the recess portion, the first portion having a first thickness and the second portion having a second thickness, the second thickness being greater than the first thickness, and wherein the recess portion includes regions having different widths in a second direction, perpendicular to the first direction.

According to an aspect of the present inventive concepts, a semiconductor device may include a first insulating structure on a substrate, the first insulating structure including a first etch stop layer and a first interlayer insulating layer on the first etch stop layer, a second insulating structure on the first insulating structure, the second insulating structure including a second etch stop layer and a second interlayer insulating layer on the second etch stop layer, a conductive line penetrating through the second insulating structure to contact the first interlayer insulating layer, the conductive line extending in a first direction parallel to an upper surface of the substrate, and a plurality of contacts penetrating through the first insulating structure, and connected to the conductive line, wherein the first interlayer insulating layer includes a recess portion for exposing the first etch stop layer, wherein the conductive line includes a protrusion that is in the recess portion and is in contact with the first etch stop layer, wherein the conductive line includes a first portion having a first thickness and being on an upper surface of the first interlayer insulating layer and a second portion having a second thickness and being between a lower surface of the protrusion and an upper surface of the conductive line, wherein the second thickness is greater than the first thickness, and wherein the protrusion has a first region having a first width in a second direction, perpendicular to the first direction, and the protrusion has a second region having a second width in the second direction, the second width being narrower than the first width.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

As used herein, the term "and/or" includes any and all combinations of one or more of the associated listed items. Expressions such as "at least one of," when preceding a list of elements, modify the entire list of elements and do not modify the individual elements of the list. Thus, for example, "at least one of A, B, or C," "at least one of A, B, and C," and "A, B, and/or C" mean either A, B, C or any combination thereof. In other words, an expression such as "at least one of," when preceding a list of elements, modifies the entire list of elements and does not modify the individual elements of the list.

Figure 1:
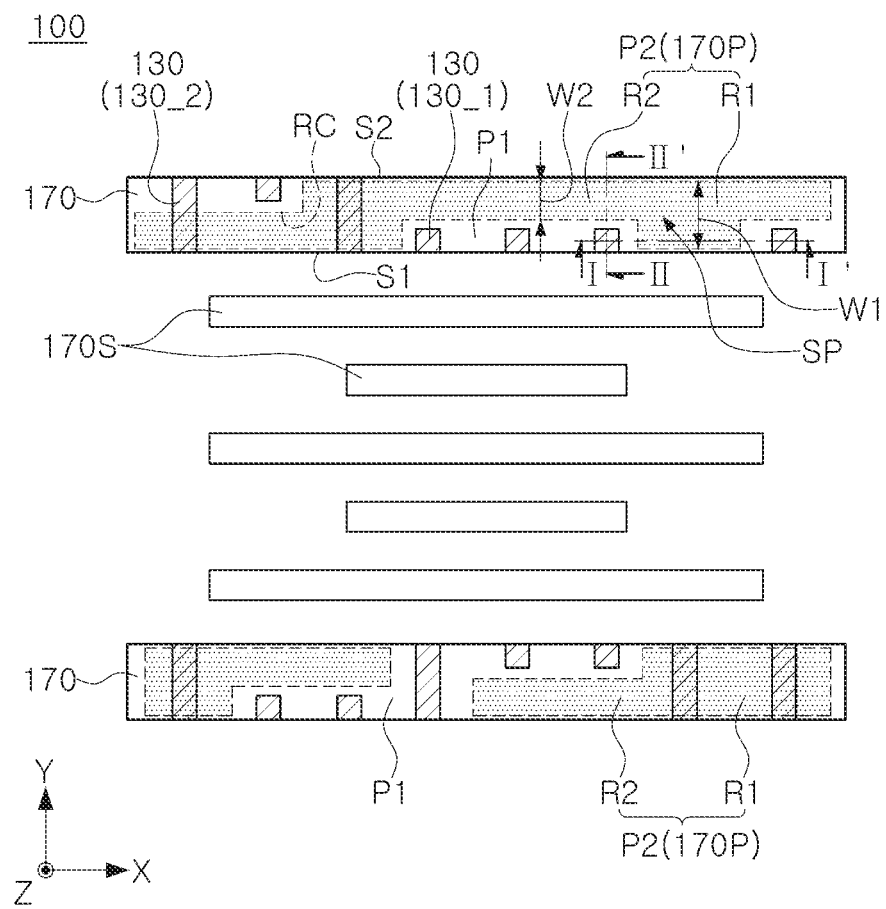
FIG. 1 is a plan view illustrating a semiconductor device according to an example embodiment.

FIG. 1 is a plan view illustrating a semiconductor device according to an example embodiment.

Figure 2A:
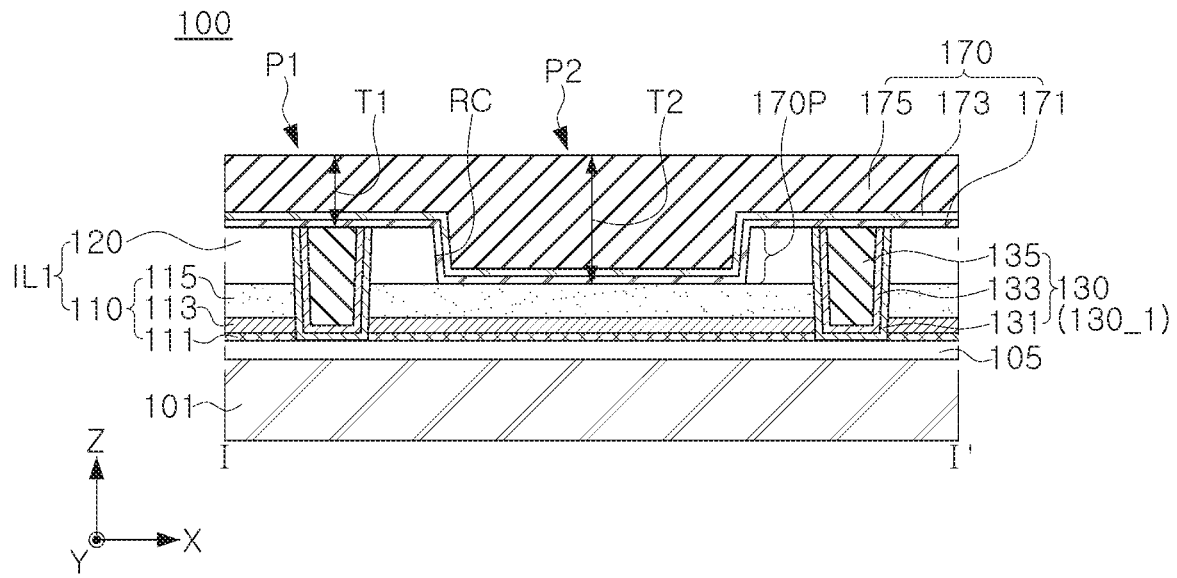
FIGS. 2A and 2B are cross-sectional views illustrating semiconductor devices according to an example embodiment.
Figure 2B:
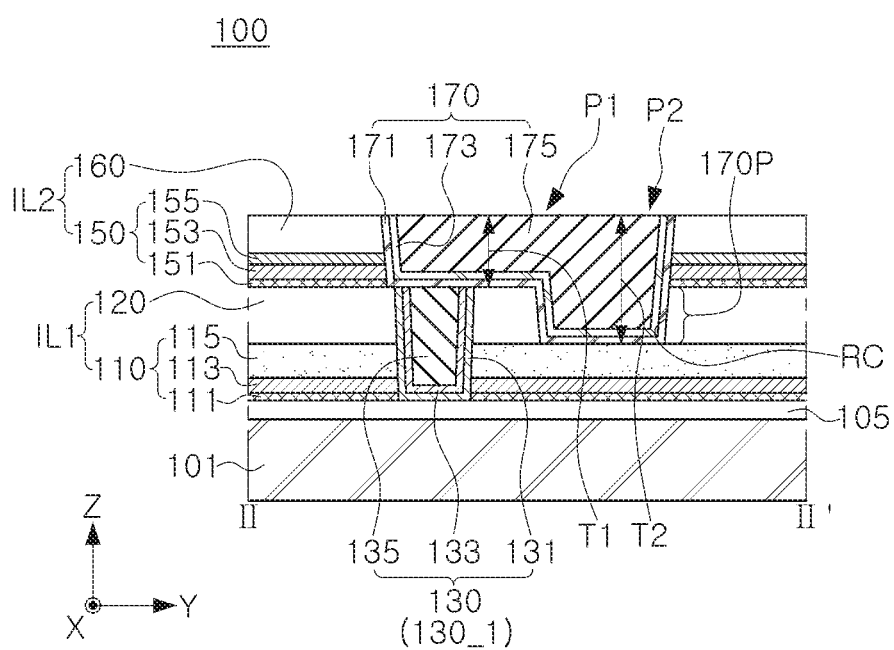

FIGS. 2A and 2B are cross-sectional views illustrating semiconductor devices according to an example embodiment. FIGS. 2A and 2B illustrate cross-sections of the semiconductor device of FIG. 1 taken along lines I-I' and respectively.

Referring to FIGS. 1 to 2B, a semiconductor device 100 may include a substrate 101, a first insulating structure IL1 on the substrate 101, contacts 130 penetrating through the first insulating structure ILL a second insulating structure IL2 on the first insulating structure ILL and a conductive line 170 penetrating through the second insulating structure IL2. The conductive line 170 may include a power line for supplying power to standard cells of the semiconductor device 100. The conductive line 170 may be disposed side by side in a pair on one standard cell to supply different power sources to the standard cell. The semiconductor device 100 may further include signal lines 170S disposed in parallel with the conductive line 170.

The substrate 101 may include a semiconductor material, such as a Group IV semiconductor, a Group III-V compound semiconductor, or a Group II-VI compound semiconductor. For example, the group IV semiconductor may include silicon (Si), germanium (Ge), or silicon germanium (SiGe). The substrate 101 may be provided as a bulk wafer, an epitaxial layer, a silicon-on-insulator (SOI) layer, a semi-conductor on insulator (SeOI) layer, or the like.

A device layer 105 may be disposed between the substrate 101 and the first insulating layer 201 and may include transistors constituting an integrated circuit. The transistors constituting an integrated circuit may be disposed on the substrate 101, and the transistors may be disposed in an region between the substrate 101 and the first insulating layer 201. The transistors constituting the integrated circuit may include a planar Metal Oxide Semiconductor FET (MOSFET), a FinFET in which an active region has a fin structure, and a Multi-Bridge Channel FET (MBCFET™) or a Gate-All-Around transistor including a plurality of channels vertically stacked on the active region, or a vertical FET (VFET), but example embodiments are not limited thereto. The integrated circuit may include a volatile memory device such as DRAM, static RAM (SRAM), or the like, and a non-volatile memory device such as PRAM, MRAM, ReRAM, a flash memory device, or the like.

The first insulating structure IL1 may be disposed on the substrate 101. The first insulating structure IL1 may include a first etch stop layer 110 and a first interlayer insulating layer 120 disposed on the first etch stop layer 110.

The first etch stop layer 110 may include, for example, at least one of silicon nitride (SiN), silicon oxynitride (SiON), silicon carbonitride (SiCN), and silicon oxycarbide (SiOC). The first etch stop layer 110 may include, for example, a metal oxide and/or a metal nitride, the metal including at least one of aluminum (Al), zirconium (Zr), hafnium (Hf), titanium (Ti), ruthenium (Ru), molybdenum (Mo), tungsten (W), copper (Cu), and cobalt (Co). The first etch stop layer 110 may include a plurality of layers, for example, a first layer 111, a second layer 113, and a third layer 115, which are sequentially stacked. In an example embodiment, the first layer 111 may include an aluminum oxide (AlO), the second layer 113 may include a silicon oxycarbide (SiOC), and the third layer 115 may include a silicon nitride (SiN). However, example embodiments of the present inventive concepts are not limited thereto, and the first etch stop layer 110 may be formed of a single layer.

The first interlayer insulating layer 120 may be formed of silicon oxide (SiO) or a low-k insulating material layer having a dielectric constant smaller than that of silicon oxide. For example, the first interlayer insulating layer 120 may include a low-k insulating material such as SiOC or SiOCH. For example, the first interlayer insulating layer 120 may include a material such as phosphor silicate glass (PSG), borophosphosilicate glass (BPSG), undoped silicate glass (USG), tetra ethyl ortho silicate (TEOS), plasma enhanced PE-TEOS (PE-TEOS), high density plasma-chemical vapor deposition (HDP-CVD) oxide, and the like.

The first interlayer insulating layer 120 may include a recess portion RC exposing an upper surface of the first etch stop layer 110. The recess portion RC may penetrate through the first interlayer insulating layer 120 in a Z direction. A protrusion 170P, which is a portion of the conductive line 170, may extend into the recess portion RC. The recess portion RC may be a region in which the first interlayer insulating layer 120 is patterned to have a desired (or alternatively, predetermined) pattern in a plan view and partially removed. The recess portion RC may include regions having different widths in a Y direction in a plan view.

Contacts 130 may penetrate through the first insulating structure IL1 to be connected to a lower wiring or a contact in a device layer 105 below the first insulating structure ILE The contacts 130 may be in contact with and connected to the conductive line 170 from an upper portion thereof through an upper surface thereof. A level of a lower surface of the contacts 130 may be lower than a level of a lower surface of the protrusion 170P of the conductive line 170. A level of an upper surface of the contacts 130 may be higher than a level of the lower surface of the protrusion 170P of the conductive line 170. The contacts 130 may have any one of a polygonal shape, a square shape, a rectangular shape, a rounded square shape, a circle, and an ellipse in plan view, parallel to the upper surface of the substrate 101.

The contacts 130 may include a contact barrier layer 131, a contact liner layer 133 on the contact barrier layer 131, and a contact metal layer 135 on the contact liner layer 133. The contact liner layer 133 may cover a side surface and a bottom surface of the contact metal layer 135. The contact barrier layer 131 may cover a side surface and a bottom surface of the contact liner layer 133. The contact barrier layer 131 may include, for example, at least one of titanium (Ti), titanium nitride (TiN), tantalum (Ta), tantalum nitride (TaN), tungsten nitride (WN), and tungsten carbon nitride (WCN). The contact liner layer 133 may include, for example, at least one of ruthenium (Ru), molybdenum (Mo), tungsten (W), and cobalt (Co). The contact metal layer 135 may include, for example, at least one of ruthenium (Ru), molybdenum (Mo), tungsten (W), copper (Cu), aluminum (Al), and cobalt (Co). In an example embodiment, in the contacts 130, at least one of the contact barrier layer 131 and the contact liner layer 133 may be omitted.

The contacts 130 may include first contacts 130_1 and second contacts 130_2. For example, the first contacts 130_1 may be spaced apart from the recess portion RC or the protrusion 170P of the conductive line 170. The first contacts 130_1 may be disposed adjacent to any one of a first side surface S1 of the conductive line 170 and a second side surface S2 of the conductive line 170, which is opposite to the first side surface S1. However, example embodiments are not limited thereto. In some example embodiments, the first contacts 130_1 may also be disposed on a center line of the conductive line 170 in the X direction. For example, the second contacts 130_2 may at least partially overlap the recess portion RC or the protrusion 170P of the conductive line 170 in the Z direction. The second contacts 130_2 may extend longer in the Y direction than the first contacts 130_1. For example, the first contacts 130_1 may have a first length in the Y direction, and the second contacts 130_2 may have a second length longer than the first length in the Y direction.

The second insulating structure IL2 may be disposed on the first insulating structure ILL The second insulating structure IL2 may include a second etch stop layer 150 and a second interlayer insulating layer 160 on the second etch stop layer 150.

The second etch stop layer 150 may include, for example, at least one of silicon nitride (SiN), silicon oxynitride (SiON), silicon carbonitride (SiCN), and silicon oxycarbide (SiOC). The second etch stop layer 150 may include, for example, a metal oxide and/or a metal nitride, the metal being including at least one of aluminum (Al), zirconium (Zr), hafnium (Hf), titanium (Ti), ruthenium (Ru), molybdenum (Mo), tungsten (W), copper (Cu), and cobalt (Co). The second etch stop layer 150 may include a plurality of layers, for example, a first layer 151, a second layer 153, and a third layer 155, which are sequentially stacked. In an example embodiment, the first layer 151 may include an aluminum oxide (AlO), the second layer 153 may include a silicon oxycarbide (SiOC), and the third layer 155 may include a silicon nitride (SiN). However, example embodiments of the present inventive concepts are not limited thereto, and the second etch stop layer 150 may be formed of a single layer.

The second interlayer insulating layer 160 may be formed of silicon oxide (SiO) or a low-k insulating material layer having a dielectric constant smaller than that of silicon oxide. For example, the second interlayer insulating layer 160 may include a low-k insulating material such as SiOC or SiOCH. For example, the second interlayer insulating layer 160 may include a material such as phosphor silicate glass (PSG), borophosphosilicate glass (BPSG), undoped silicate glass (USG), tetra ethyl ortho silicate (TEOS), plasma enhanced PE-TEOS (PE-TEOS), high density plasma-chemical vapor deposition (HDP-CVD) oxide, and the like.

The conductive line 170 may be disposed on the first insulating structure IL1 and the contacts 130. The conductive line 170 may have a line shape extending in the X direction in a plan view. The conductive line 170 may be formed by a damascene process in which an insulating layer is formed, patterned, and then a metal material layer is filled.

The conductive line 170 may include a barrier layer 171, a liner layer 173 on the barrier layer 171, and a metal layer 175 on the liner layer 173. The liner layer 173 may cover a side surface and a bottom surface of the metal layer 175. The barrier layer 171 may cover a side surface and a bottom surface of the liner layer 173. The barrier layer 171 may include, for example, at least one of titanium (Ti), titanium nitride (TiN), tantalum (Ta), tantalum nitride (TaN), tungsten nitride (WN), and tungsten carbon nitride (WCN). The liner layer 173 may include, for example, at least one of ruthenium (Ru), molybdenum (Mo), tungsten (W), and cobalt (Co). The metal layer 175 may include, for example, at least one of ruthenium (Ru), molybdenum (Mo), tungsten (W), copper (Cu), aluminum (Al), and cobalt (Co).

The conductive line 170 may include a first portion P1 on the first interlayer insulating layer 120 and a second portion P2 on the first etch stop layer 110. The second portion P2 may include a protrusion 170P provided to reduce electrical resistance of the conductive line 170, and the second portion P2 may be a portion having a thickness greater than that of the first portion P1. For example, the first portion P1 may have a first thickness T1 on an upper surface of the first interlayer insulating layer 120, and the second portion P2 may have a second thickness T2, which is greater than the first thickness T1, on an upper surface of the first etch stop layer 110. The second thickness T2 may correspond to a thickness between a lower surface of the protrusion 170P and an upper surface of the conductive line 170. In an example embodiment, the second thickness T2 may be thicker than the first thickness T1 by about 15 nm to about 20 nm. The protrusion 170P may extend further downwardly than the second insulating structure IL2 and may be disposed in the recess portion RC of the first interlayer insulating layer 120. The protrusion 170P may be in contact with the first etch stop layer 110. The protrusion 170P may be disposed between the first contacts 130_1 in the X direction in which one conductive line 170 extends.

The first portion P1 may overlap at least one of the contacts 130 in the Z direction. Because the conductive line 170 includes the second portion P2 including the protrusion 170P, electrical resistance may be reduced by securing a large space filled with metal in the conductive line 170.

A planar shape of the protrusion 170P needs to be designed in consideration of the disposition and shape of the contacts 130 disposed immediately below the conductive line 170. According to an example embodiment of the present inventive concepts, the space capable of increasing the thickness of the conductive line 170 may be sufficiently secured, but a separate layer may be added to a layout of the semiconductor device to reduce or minimize damages applied to the contacts 130 when the recess portion RC or the protrusion 170P is formed. The layer may have a pattern satisfying a design rule considered when designing a semiconductor device. Accordingly, the layer may be designed so that there is no problem in the patterning of the corresponding layer in the photolithography process step.

As an example embodiment of the present inventive concepts, a layer of a region indicated by a dotted line in FIG. 1 may be added to the layout of the semiconductor device. The layer may be provided to form the recess portion RC or the protrusion 170P. When the thickness of the conductive line 170 increases, the electrical resistance may decrease, but an etching process of the first interlayer insulating layer 120 performed to increase the thickness of the conductive line 170 may damage the contacts 130. That is, if an area in which the protrusion 170P of the conductive line 170 is disposed is secured as much as possible to reduce electrical resistance, an area of the contact 130 disposed below the conductive line 170 and overlapping the protrusion 170P may increase, thereby increasing a risk of damages to the contacts 130 by the etching process. Accordingly, a pattern of the layer needs to be properly designed so that the reduction in electrical resistance of the conductive line 170 can be secured as much as possible, while reducing or minimizing damage to the contacts 130.

In an example embodiment of manufacturing the semiconductor device 100 using a layout including the layer having the optimal design, a protrusion 170P of the conductive line 170 may be spaced apart from the first contacts 130_1, may have a desired (or alternatively, predetermined) pattern in a plan view such that at least a portion of the conductive line 170 overlaps the second contacts 130_2 in the Z direction. For example, as shown in FIG. 1, the protrusion 170P of the conductive line 170 may include a first region R1 having a first width W1 in the Y direction and a second region having a second width W2, narrower than the first width W1, in the Y direction. One of side surfaces of the first region R1, extending in the X direction, and one of side surfaces of the second region R2, extending in the X direction, may be shifted from each other. A side portion SP which is bent due to a difference in width may be formed between the first region R1 and the second region R2 of the conductive line 170. The side surface SP may face a side surface of the first contacts 130_1 that overlaps the conductive line 170 in the Z direction. However, a planar shape of the protrusion 170P of the conductive line 170 is not limited to the illustrated one, and may be variously changed according to the disposition and shape of the contacts 130.

Figure 3:
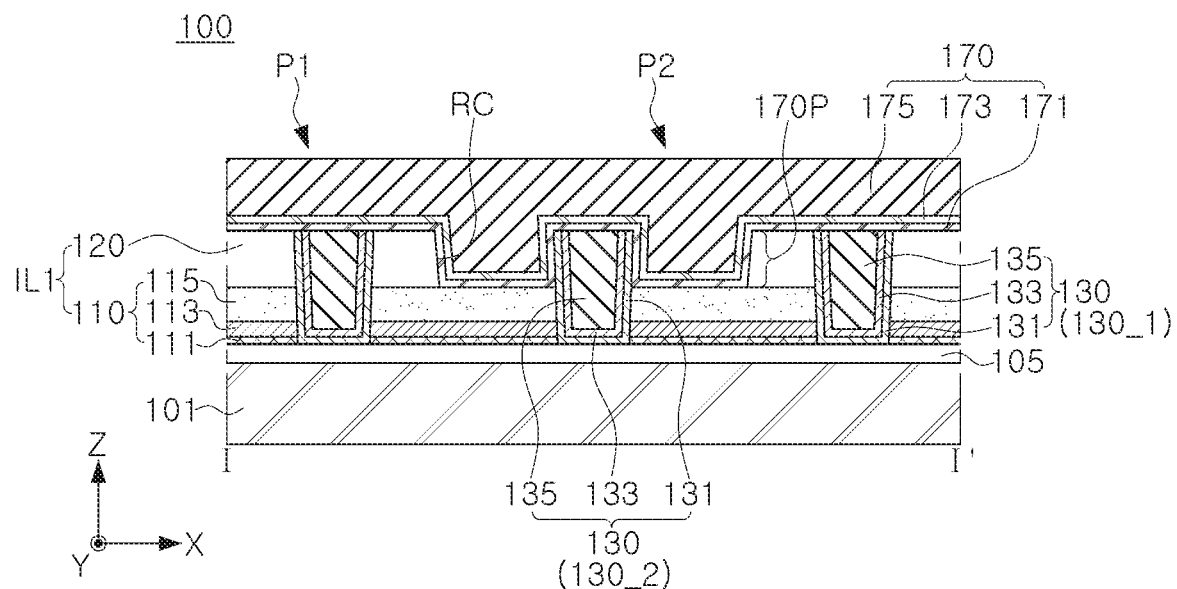
FIG. 3 is a cross-sectional view illustrating a semiconductor device according to an example embodiment.

FIG. 3 is a cross-sectional view illustrating a semiconductor device according to an example embodiment. FIG. 3 illustrates a region corresponding to FIG. 2A.

Referring to FIG. 3, in another region of the semiconductor device 100, second contacts 130_2 may overlap a protrusion 170P of the conductive line 170 in a Z direction. In this case, a second portion P2 of the conductive line 170 may include a portion surrounding upper surfaces and upper regions of side surfaces of the second contacts 130_2. The second contacts 130_2 may have a shape in which a length in the Y direction is longer than a length in the X direction in a plan view, and may extend longer in the Y direction than the first contacts 130_1. The conductive line 170 may have a first thickness at the second portion P2, and a second thickness smaller than the first thickness on the second contacts 130_2.

Figure 4:
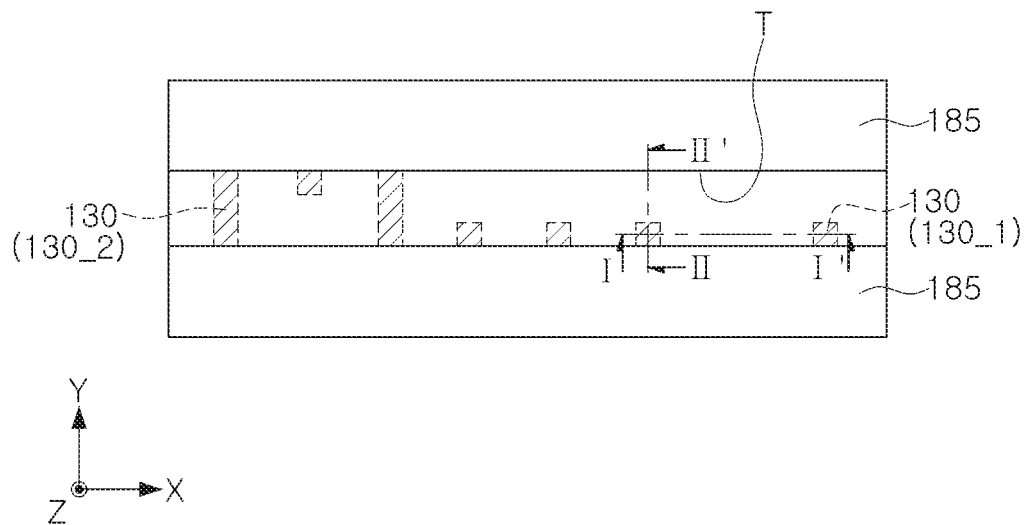
FIGS. 4 to 17B are diagrams illustrating a method of manufacturing a semiconductor device according to a process sequence, according to an example embodiment.

FIGS. 4 to 17B are diagrams illustrating a method of manufacturing a semiconductor device according to a process sequence according to an example embodiment. FIGS. 4, 6, and 8 are plan views according to the process sequence of the region corresponding to FIG. 1, respectively, and FIGS. 5A, 5B, 7A, 7B, and FIGS. 9A to 17B are cross-sectional views according to the process sequence according to a region corresponding to FIGS. 2A and 2B, respectively.

Figure 5A:
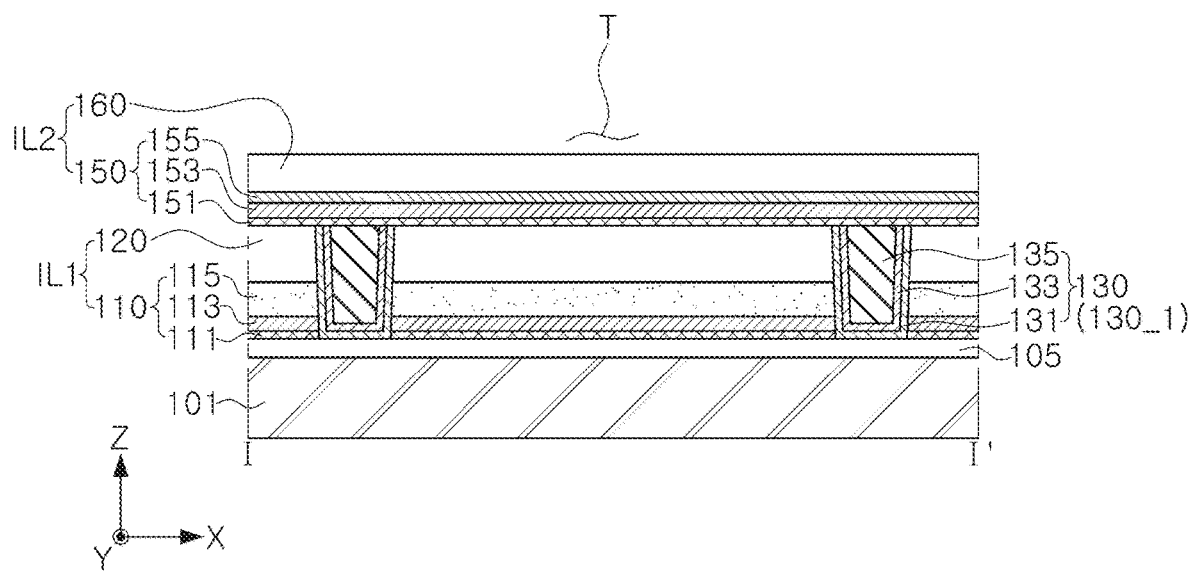
Figure 5B:
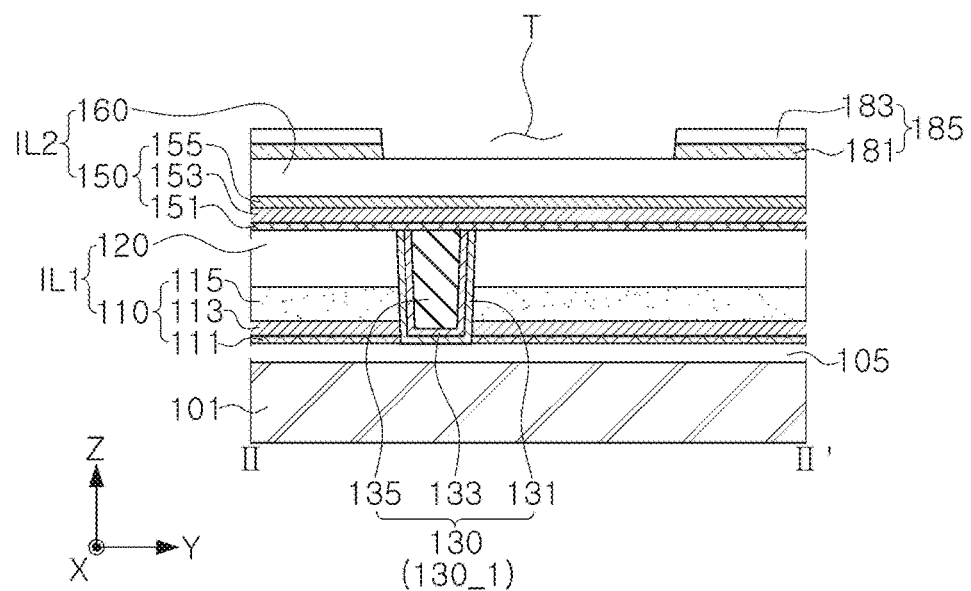
Figure 6:
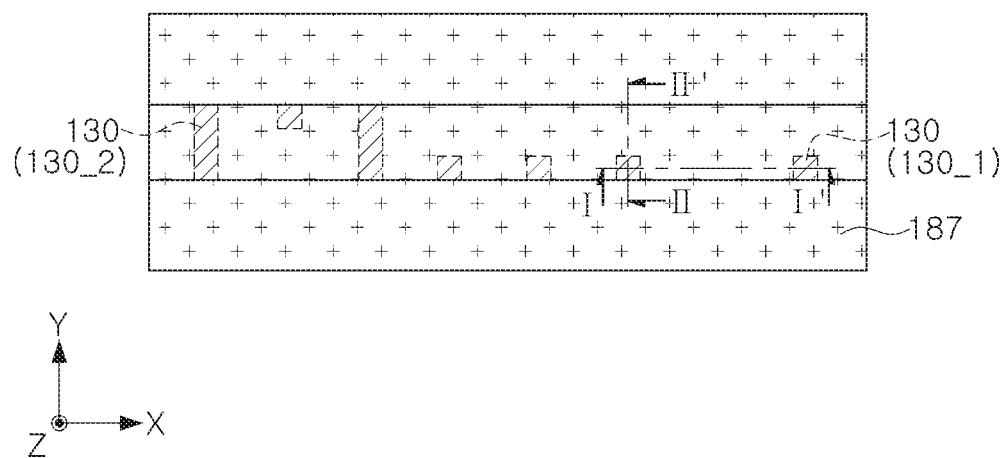

Referring to FIGS. 4, 5A, and 5B, a first insulating structure IL1 and contacts 130 may be formed on a substrate 101, a second insulating structure IL2 may be formed on the first insulating structure ILL a hard mask pattern 185 may be formed on the second insulating structure IL2, and a trench T opening a portion of the hard mask pattern 185 may be formed.

Before forming the first insulating structure ILL an integrated circuit including transistors may be formed on the substrate 101 through a front end of line (FEOL) process. The integrated circuit including the transistors may be formed in a region between the substrate 101 and the first insulating structure IL1.

Forming the first insulating structure IL1 may include sequentially forming a first etch stop layer 110 and a first interlayer insulating layer 120. Forming the first etch stop layer 110 may include forming a plurality of layers, for example, a first layer 111, a second layer 113, and a third layer 115.

After the first insulating structure IL1 is patterned and filled with a conductive material, a planarization process may be performed to form contacts 130. Forming the contacts 130 may include forming a contact barrier layer 131, a contact liner layer 133, and a contact metal layer 135. A chemical vapor deposition process or an atomic layer deposition process may be performed to form a contact barrier layer 131 and a contact liner layer 133. The contacts 130 may be formed by performing a chemical vapor deposition process or an atomic layer deposition process.

Forming the second insulating structure IL2 may include sequentially forming a second etch stop layer 150 and a second interlayer insulating layer 160. Forming the second etch stop layer 150 may include forming a plurality of layers, for example, a first layer 151, a second layer 153, and a third layer 155.

A hard mask pattern 185 including a first mask pattern 181 and a second mask pattern 183 may be formed on the second insulating structure IL2, and a trench T exposing a portion of the second insulating structure IL2 may be formed by performing a separate lithography process and an etching process and patterning the hard mask pattern 185. The first mask pattern 181 may include titanium nitride (TiN), and the second mask pattern 183 may include silicon oxycarbide (SiOC). The trench T may have a line shape extending in an X direction.

Figure 7A:
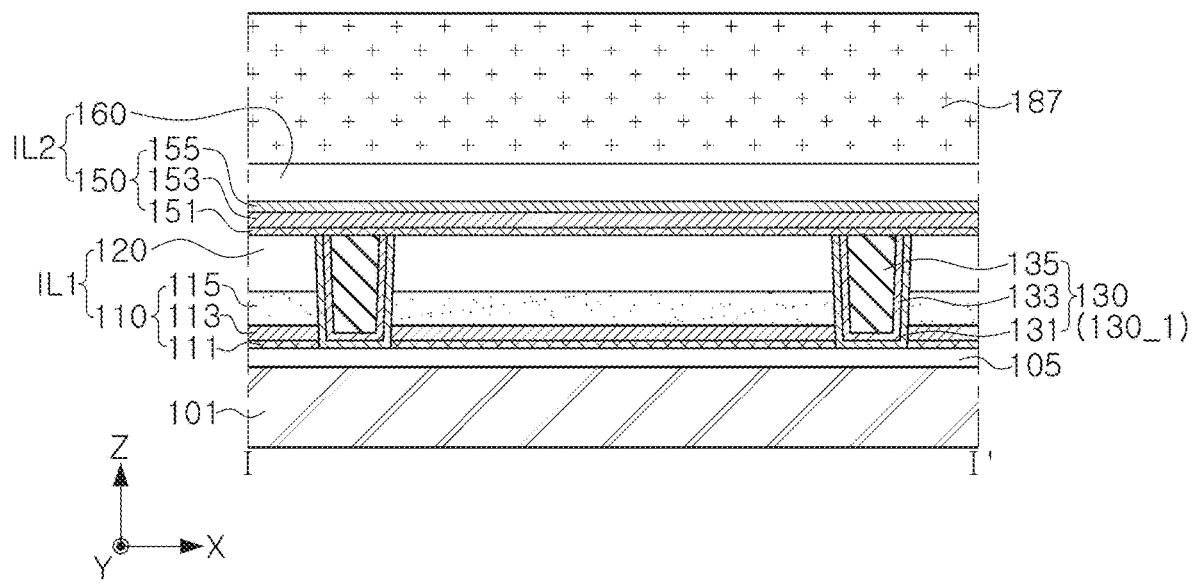
Figure 7B:
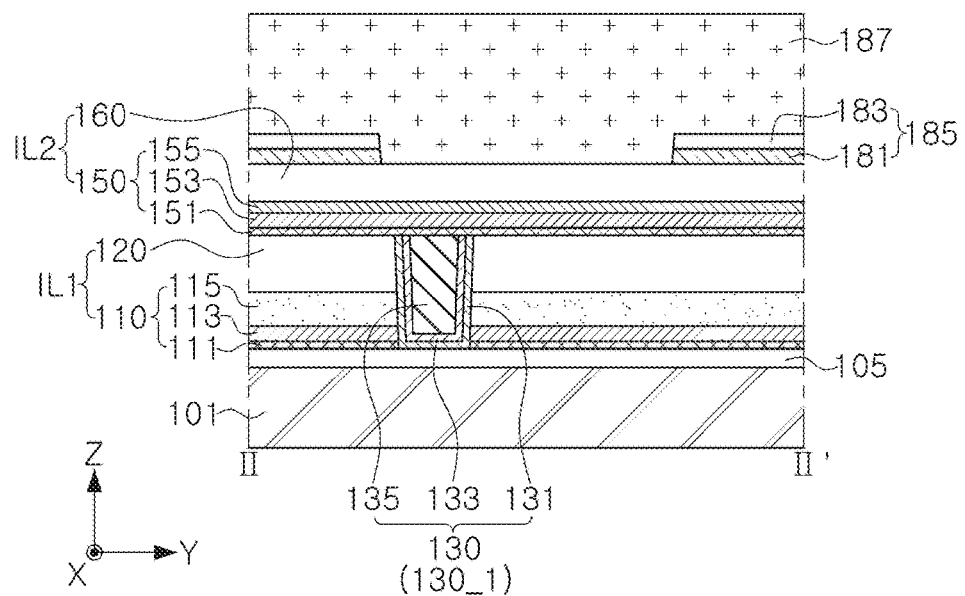
Figure 8:
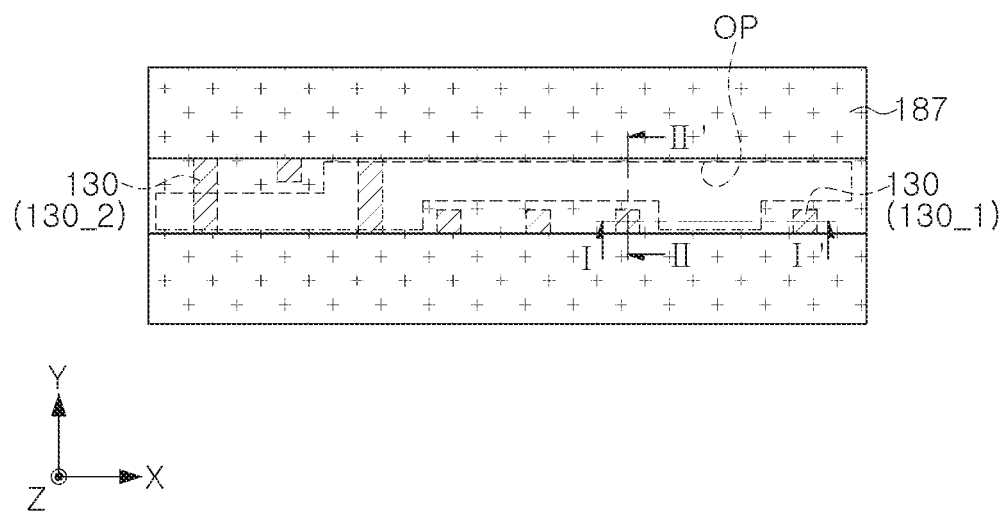

Referring to FIGS. 6, 7A, and 7B, a photoresist 187 may be formed on a hard mask pattern 185.

The photoresist 187 may partially cover a second insulating structure IL2 exposed by the trench T, and may be formed to cover an upper surface of the hard mask pattern 185.

Figure 9A:
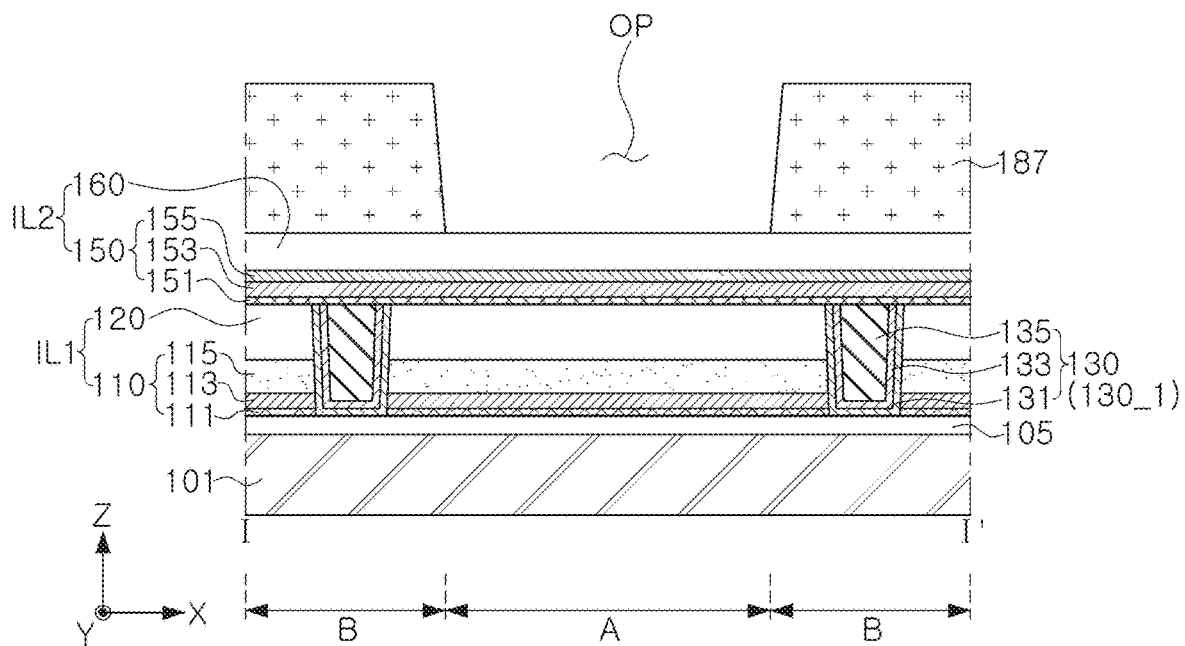
Figure 9B:
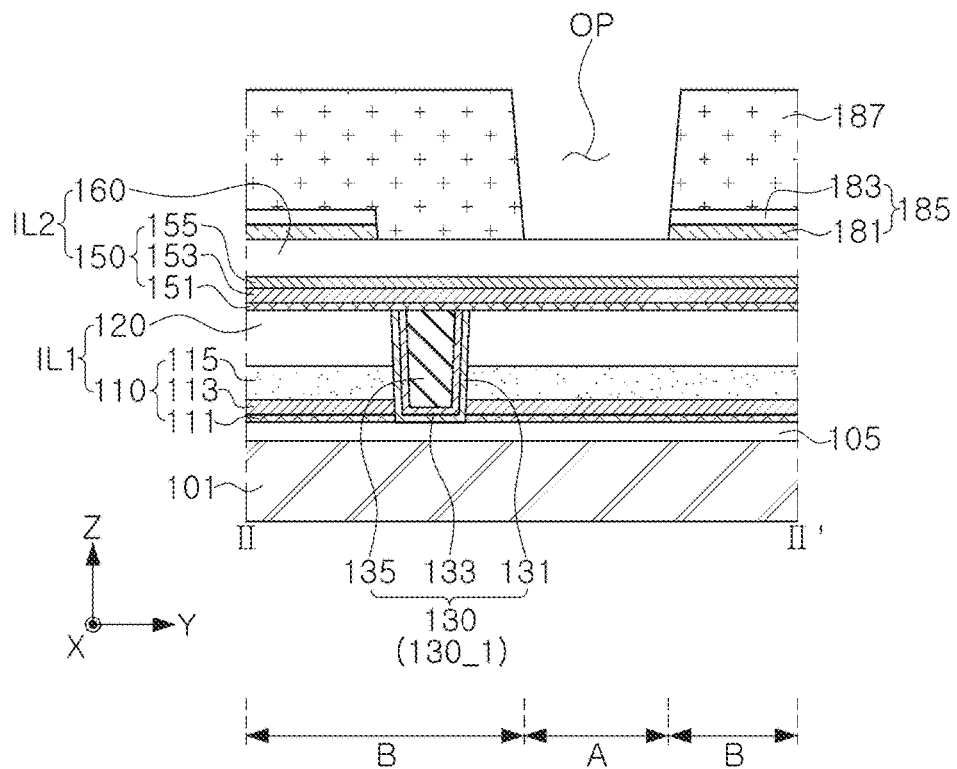

Referring to FIGS. 8, 9A and 9B, an opening OP may be formed by performing exposure and development processes on a photoresist 187. The opening OP may be formed by partially removing the photoresist 187 on a region corresponding to the protrusion 170P of the conductive line 170 of FIG. 1. The opening OP may be formed to have a desired (or alternatively, predetermined) pattern in the trench T, as shown in FIG. 8.

A pattern of the opening OP may be selected as a design capable of securing a reduction in electrical resistance of the conductive line 170 to be formed in a subsequent process as much as possible while reducing or minimizing damage to contacts 130. Hereinafter, a region overlapping the region in which the opening OP is formed in the photoresist 187 will be referred to as a recess region A, and the region overlapping the region in which the opening OP is not formed in the photoresist 187 will be referred to as a normal region B.

Figure 10A:
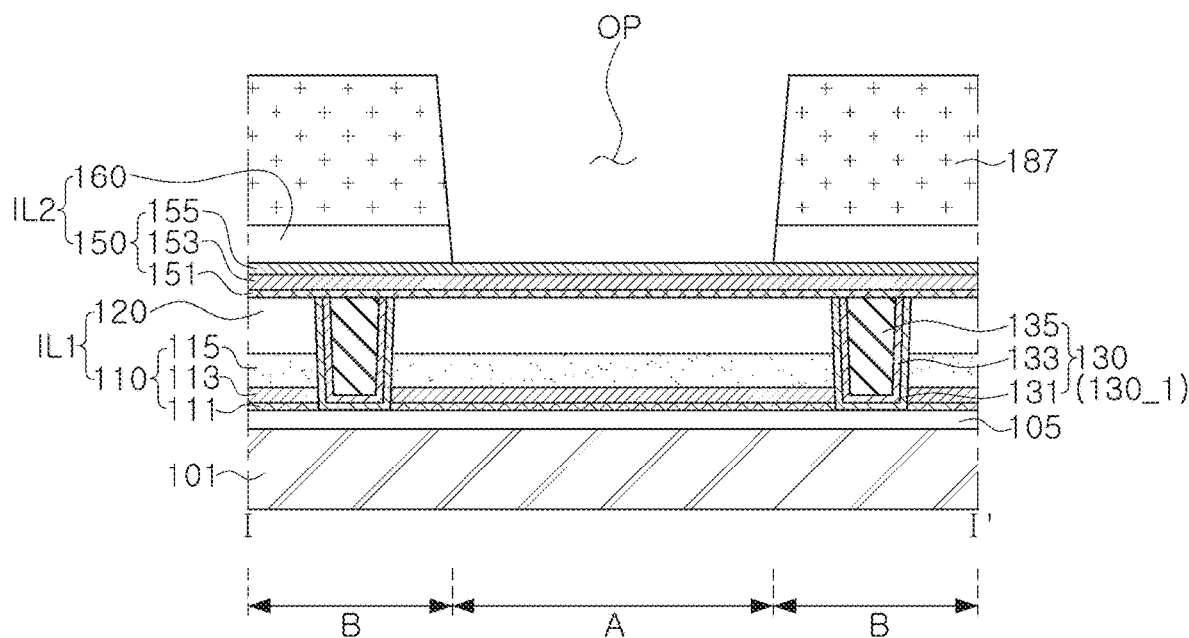
Figure 10B:
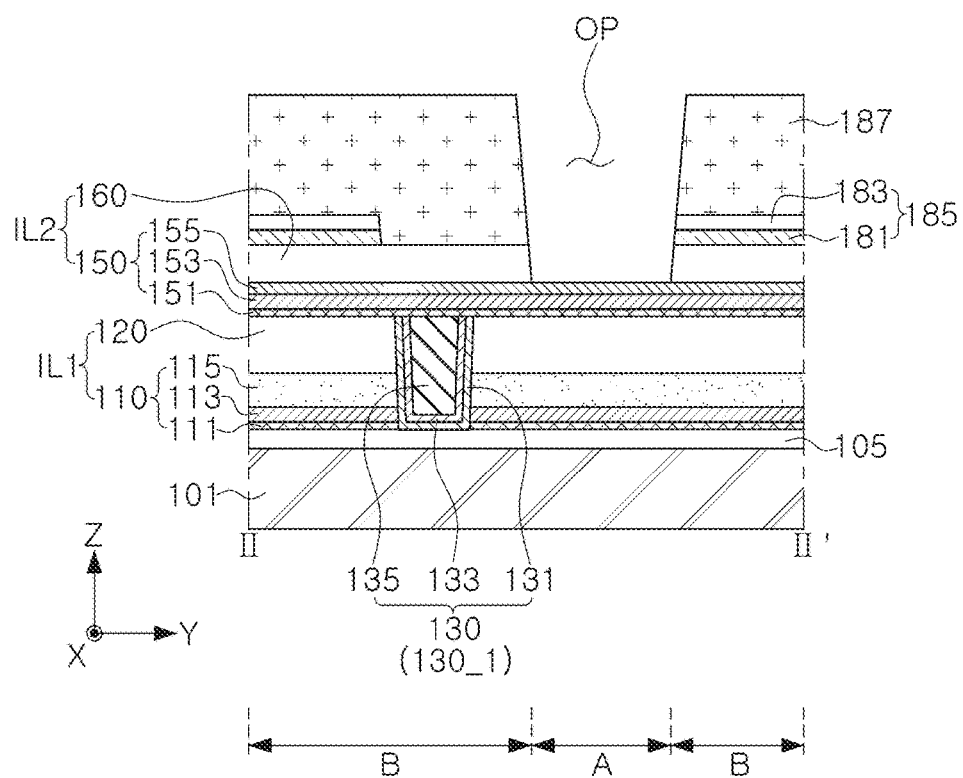

Referring to FIGS. 10A and 10B, a portion of a second interlayer insulating layer 160 may be etched using a photoresist 187 as an etching mask in a recess region A. The second interlayer insulating layer 160 may be partially removed under an opening OP. By etching a portion of the second interlayer insulating layer 160, a third layer 155 of a second etch stop layer 150 may be exposed in the recess region A.

Figure 11A:
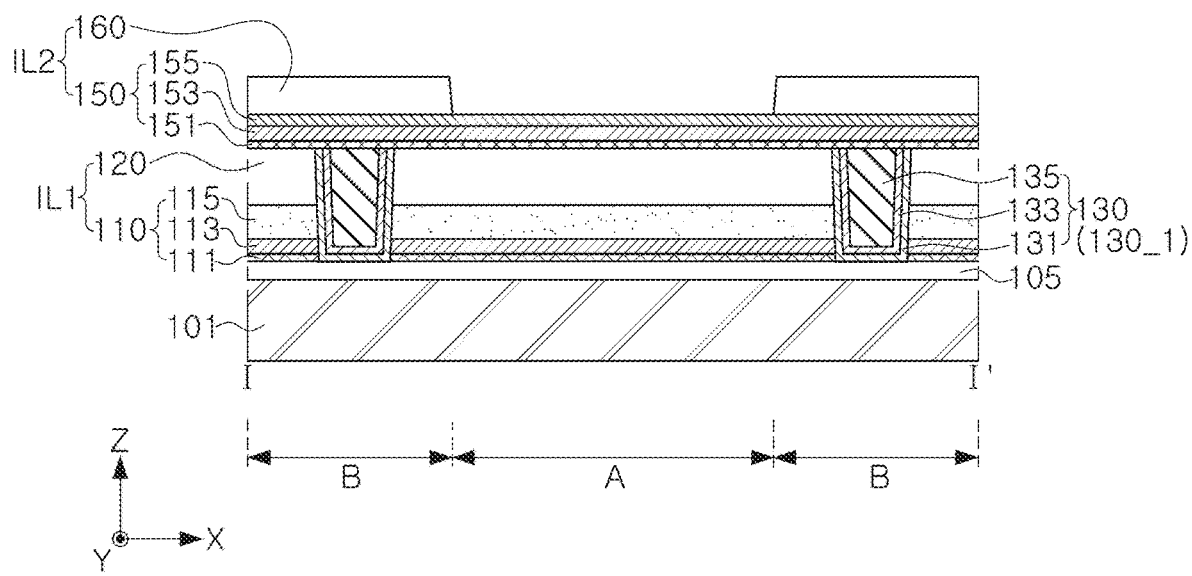
Figure 11B:
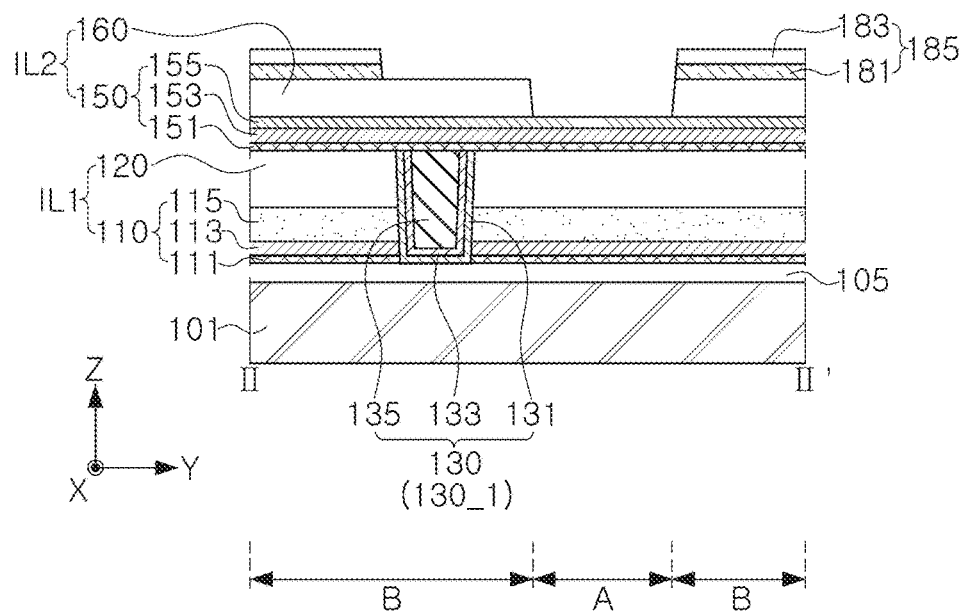

Referring to FIGS. 11A and 11B, a photoresist 187 may be removed. The photoresist 187 may be removed by performing a stripping or ashing process. The photoresist 187 may be removed using, for example, a solution containing, $H_2O_2$, $H_2SO_4$ or the like, or may be removed using a gas such as $O_2$, $N_2$, $H_2$.

Figure 12A:
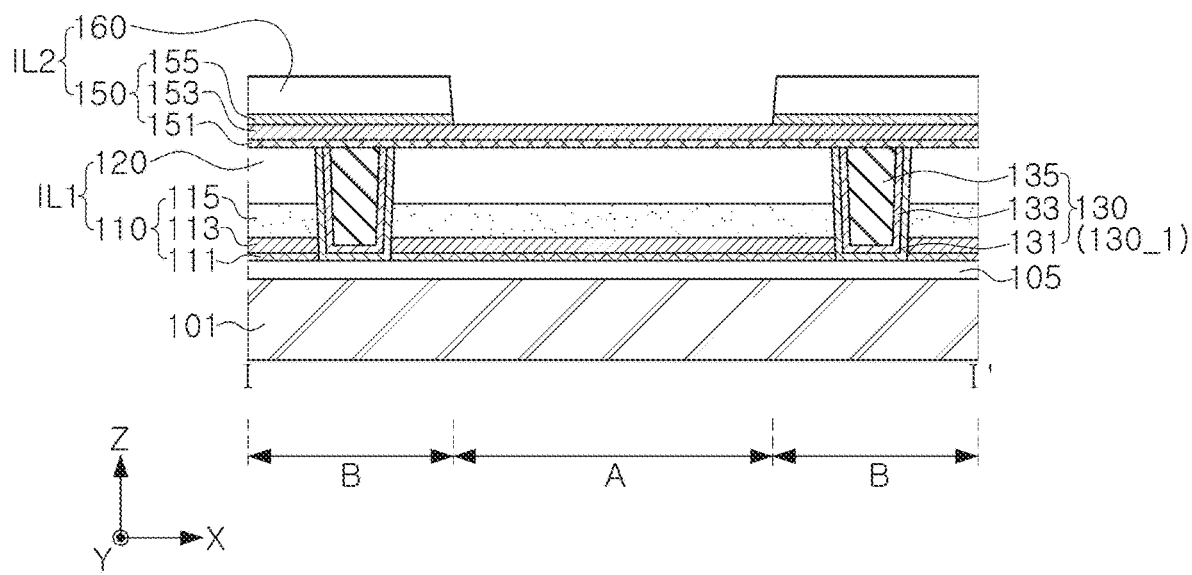
Figure 12B:
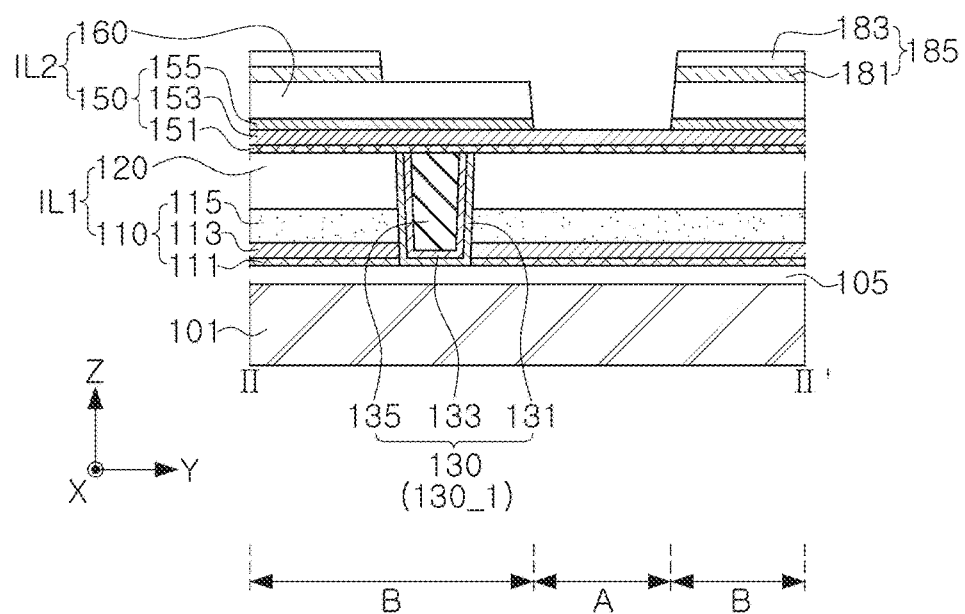

Referring to FIGS. 12A and 12B, a portion of a third layer 155 of a second etch stop layer 150 may be etched using the second interlayer insulating layer 160 as an etching mask in the recess region A. In the recess region A, a portion of a second layer 153 of the second etch stop layer 150 may be exposed.

Figure 13A:
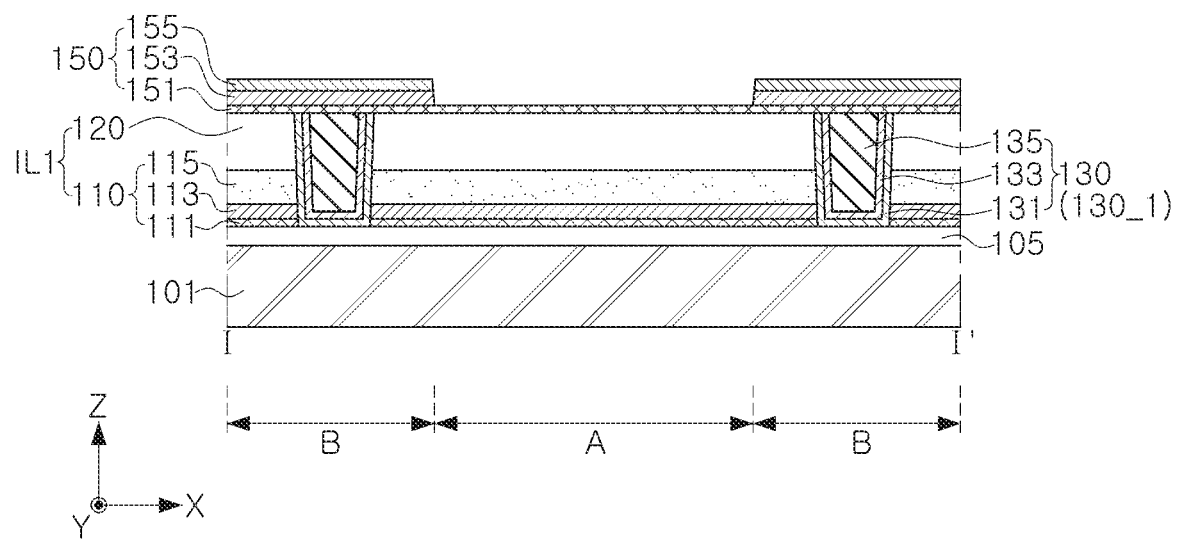
Figure 13B:
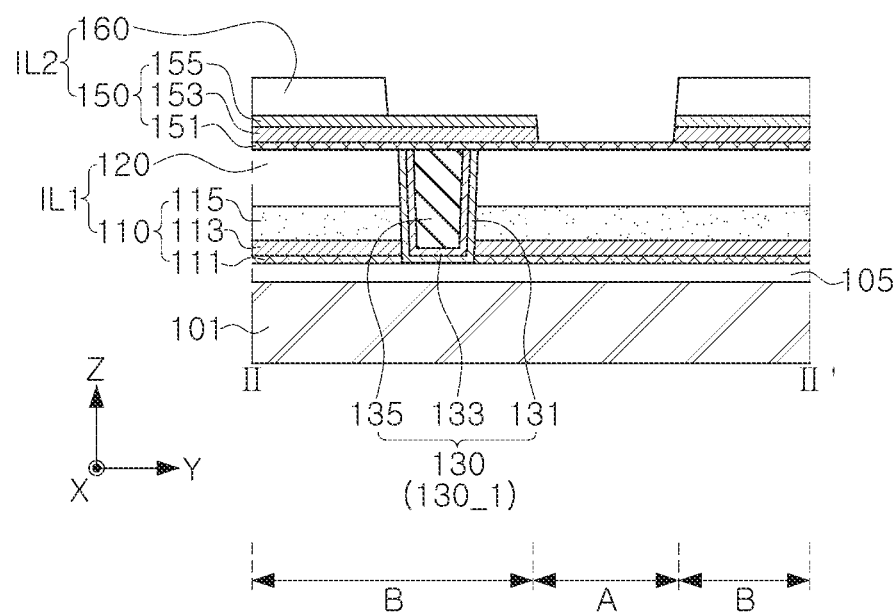

Referring to FIGS. 13A and 13B, a portion of a second layer 153 of a second etch stop layer 150 may be etched using a second interlayer insulating layer 160 as an etching mask in the recess region A, and a portion of the second interlayer insulating layer 160 may be etched using a hard mask pattern 185 as an etching mask in a normal region B.

The hard mask pattern 185 in the recess region A may be removed during or after an etching process in the present step.

Figure 14A:
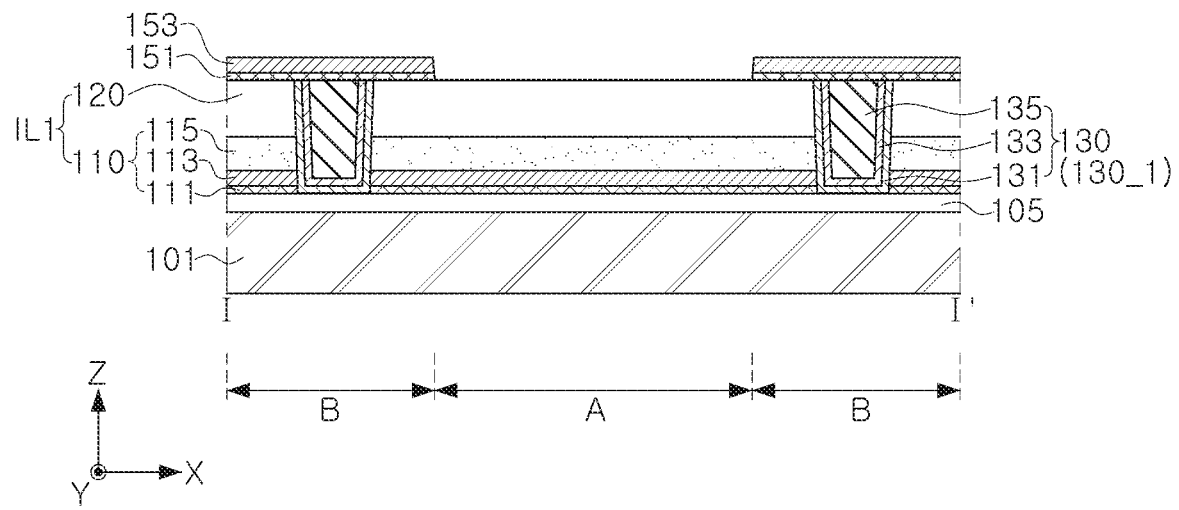
Figure 14B:
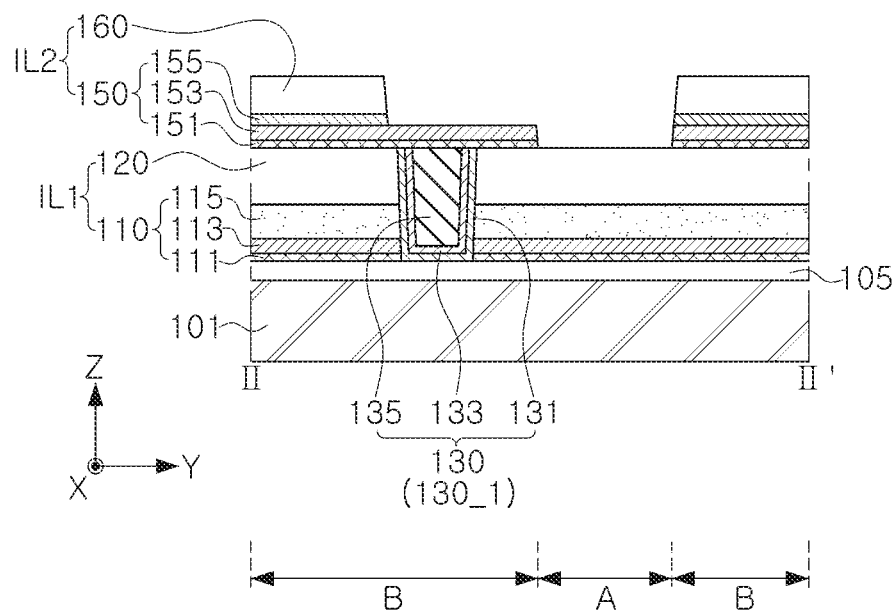

Referring to FIGS. 14A and 14B, a portion of a first layer 151 of a second etch stop layer 150 may be etched using a second layer 153 of the second etch stop layer 150 as an etch mask in the recess region A, and a portion of a third layer 155 of the second etch stop layer 150 may be etched using a second interlayer insulating layer 160 as an etching mask in the normal region B.

Figure 15A:
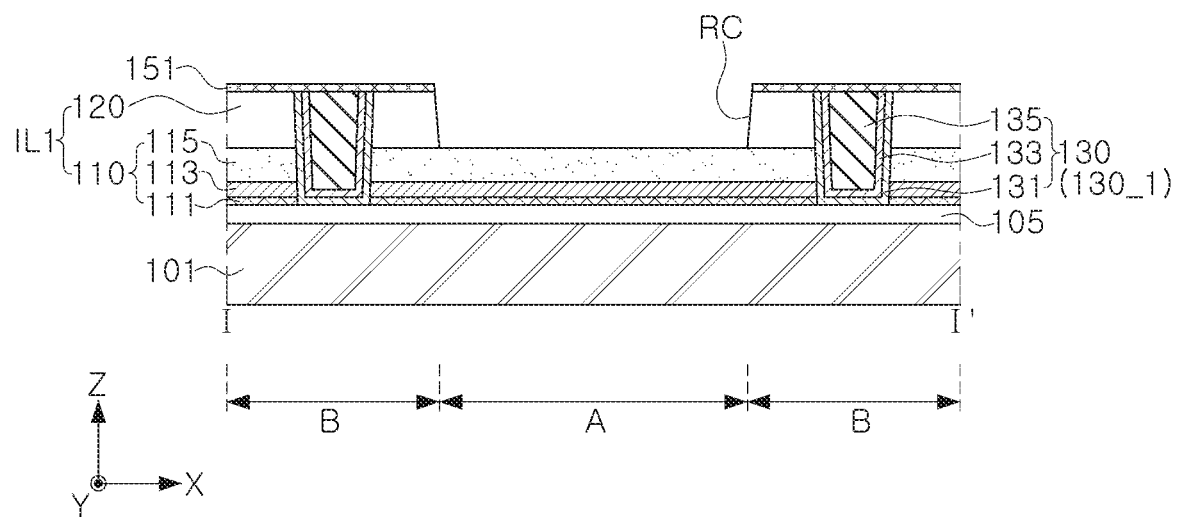
Figure 15B:
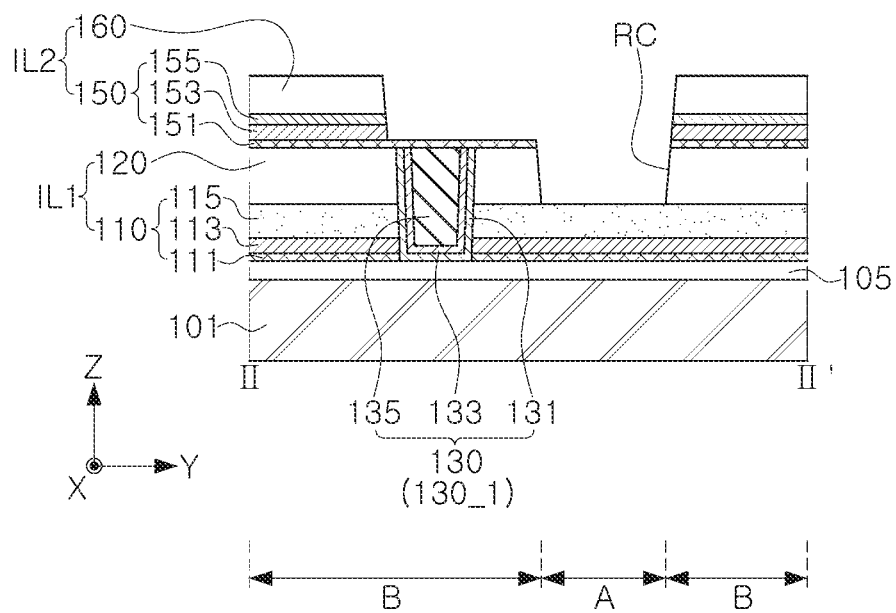

Referring to FIGS. 15A and 15B, a portion of a first interlayer insulating layer 120 may be etched using a second layer 153 of a second etch stop layer 150 as an etching mask in the recess region A, and a portion of a first layer 151 of a first etch stop layer 110 may be etched using a second interlayer insulating layer 160 as an etching mask in the normal region B. A recess portion RC may be formed in the first interlayer insulating layer 120, and the recess portion RC may expose the first etch stop layer 110 in the recess region A. The recess portion RC may be formed in the first interlayer insulating layer 120 in a planar shape corresponding to the opening OP of FIG. 8. Because first contacts 130_1 are spaced apart from the recess portion RC, the first contacts may not be exposed to an etching process. Also, the first contacts 130_1 may be protected from an etching process by the first layer 151 of the second etch stop layer 150. However, in some example embodiments, second contacts 130_2 may be partially exposed to the recess portion RC.

Figure 16A:
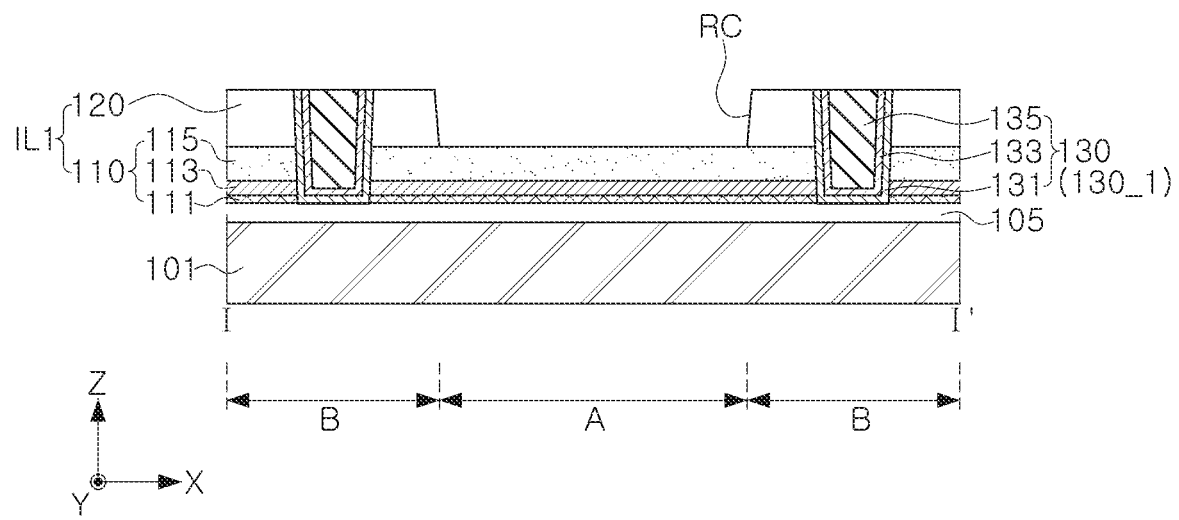
Figure 16B:
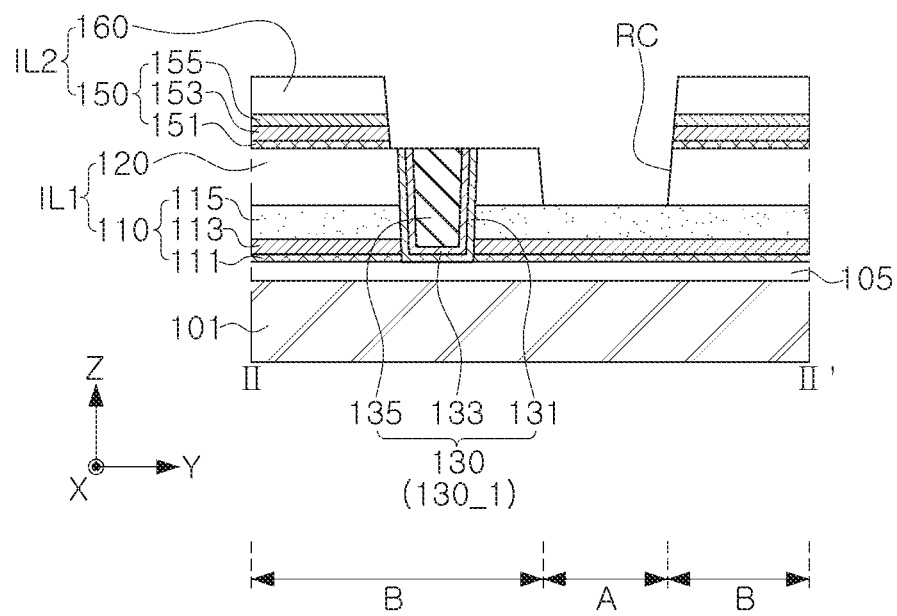

Referring to FIGS. 16A and 16B, a portion of a first layer 151 of a second etch stop layer 150 may be etched using a second interlayer insulating layer 160 as an etching mask in the normal region B. Accordingly, upper surfaces of contacts 130 may be exposed.

Figure 17A:
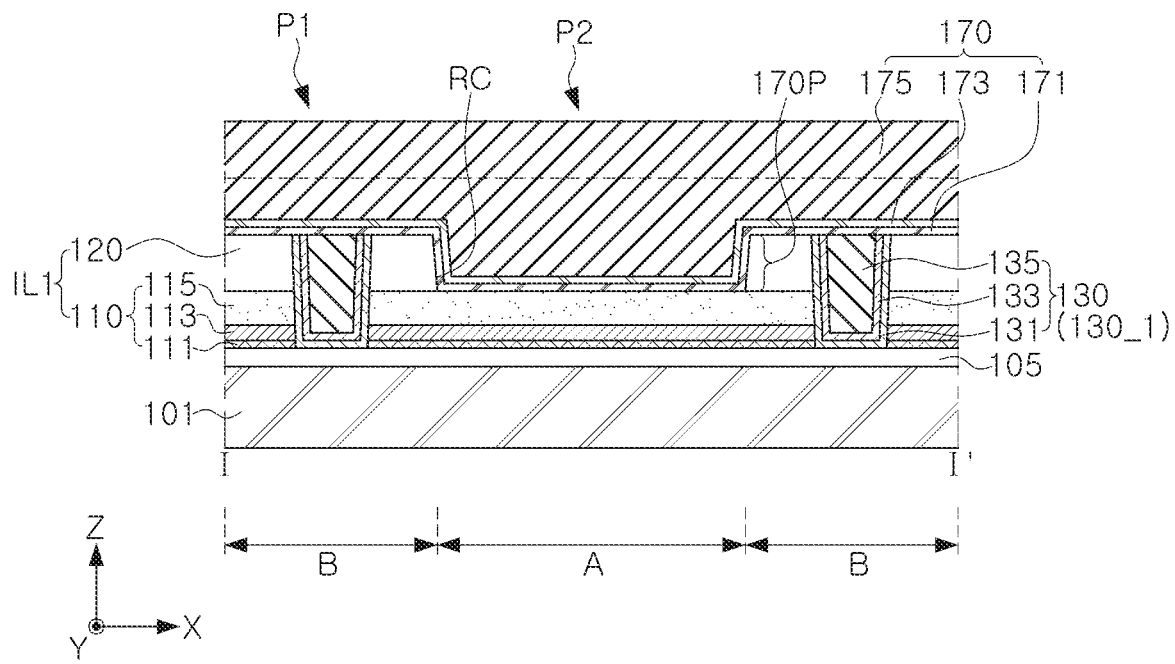
Figure 17B:
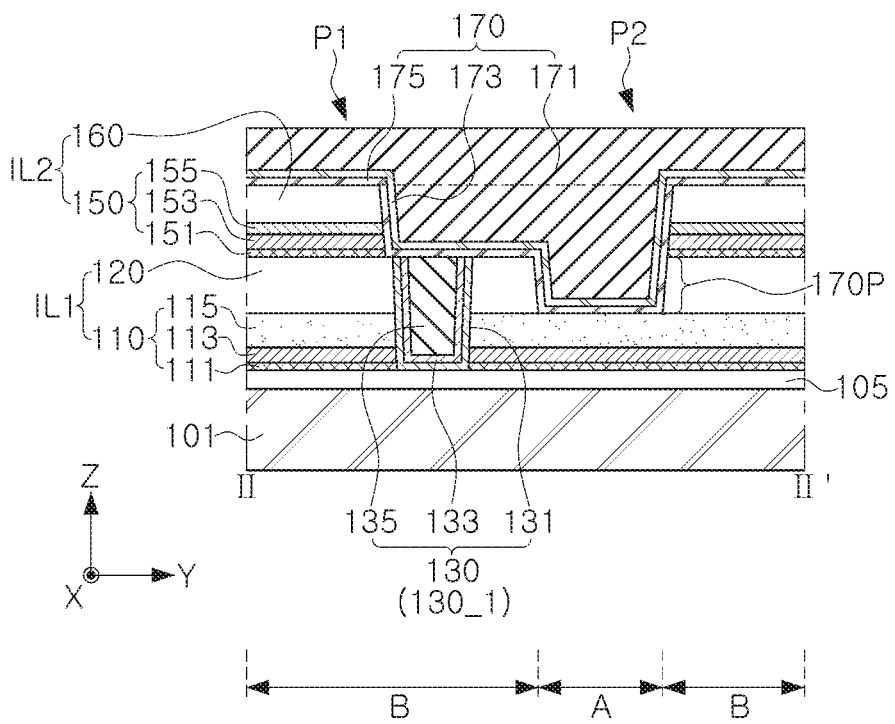

Referring to FIGS. 17A and 17B, a conductive line 170 may be formed by forming material layers constituting the conductive line and performing a planarization process. A protrusion 170P may be formed in the recess portion RC, and a second portion P2 of the conductive line 170 may have a thickness greater than a thickness of a first portion P1 of the conductive line 170. The planarization process may be performed up to, for example, a portion indicated by a dotted line in the drawing, so that an upper surface of the second interlayer insulating layer 160 may be exposed and the conductive line 170 may be formed in a line-shaped pattern. Accordingly, the semiconductor device 100 of FIG. 1 may be manufactured.

As set forth above, according to the above example embodiments of the present inventive concepts, by optimizing or appropriately designing a planar shape of the protrusion of the conductive line, a semiconductor device having improved electrical characteristics and reliability may be provided. In other words, according to the above example embodiments, a semiconductor device having improved electrical characteristics and reliability may be implemented by reducing the electrical resistance of the conductive line, while reducing or minimizing etch damage of contacts, which are disposed below the conductive line.

Some advantages and effects of the present inventive concepts may be easily understood in view of the above specific example embodiments of the present inventive concepts. However, various and advantageous advantages and effects of the present inventive concepts are not limited to the advantages and effects of the above example embodiments.

While some example embodiments have been shown and described above, it will be apparent to those skilled in the art that modifications and variations could be made without departing from the scope of the present inventive concepts as defined by the appended claims.

What is claimed is:

1. A semiconductor device, comprising:
a first insulating structure on a substrate, the first insulating structure including a first etch stop layer and a first interlayer insulating layer on the first etch stop layer;
a second insulating structure on the first insulating structure, the second insulating structure including a second etch stop layer and a second interlayer insulating layer on the second etch stop layer;
a conductive line penetrating through the second insulating structure, and extending in a first direction parallel to an upper surface of the substrate; and
a plurality of contacts penetrating through the first insulating structure, and connected to the conductive line,
wherein the conductive line includes a protrusion extending further downwardly than the second insulating structure, the protrusion penetrating through the first interlayer insulating layer and being in contact with the first etch stop layer,
wherein a level of a lower surface of the protrusion is higher than a level of a lower surface of the plurality of contacts, and
wherein the protrusion includes a first region having a first width and a second region having a second width, in a second direction perpendicular to the first direction, the second width being narrower than the first width.

2. The semiconductor device of claim 1, wherein the protrusion has a side surface portion bent by a difference in width between the first region and the second region.

3. The semiconductor device of claim 2, wherein
at least one of the contacts overlaps the conductive line in a vertical direction, and
the bent side surface portion of the protrusion faces a side surface of the at least one of the contacts.

4. The semiconductor device of claim 1, wherein on a same side along the second direction, one of side surfaces of the first region that extends in the first direction and one of side surfaces of the second region that extends in the first direction are shifted from each other.

5. The semiconductor device of claim 1, wherein the plurality of contacts comprise first contacts spaced apart from the protrusion.

6. The semiconductor device of claim 5, wherein the protrusion is between the first contacts in the first direction.

7. The semiconductor device of claim 5, wherein a level of an upper surface of the first contacts in contact with the conductive line is higher than a level of the lower surface of the protrusion.

8. The semiconductor device of claim 5, wherein
the plurality of contacts further comprise second contacts, the second contact at least partially overlapping the protrusion in a vertical direction, and
the protrusion surrounds upper surfaces and an upper region of side surfaces of the second contacts.

9. The semiconductor device of claim 1, wherein
the conductive line comprises a first portion on the first interlayer insulating layer and a second portion between a lower surface of the protrusion and an upper surface of the conductive line, the first portion having a first thickness and the second portion having a second thickness, and
the second thickness is greater than the first thickness.

10. The semiconductor device of claim 9, wherein the first portion overlaps at least one of the plurality of contacts in a vertical direction perpendicular to an upper surface of the substrate.

11. The semiconductor device of claim 1, wherein the conductive line comprises a barrier layer, a liner layer on the barrier layer, and a metal layer on the liner layer.

12. A semiconductor device, comprising:
a conductive line on a substrate, the conductive line extending in a first direction parallel to an upper surface of the substrate;
an insulating structure between the substrate and the conductive line, the insulating structure including a plurality of insulating layers; and
a plurality of contacts penetrating through the insulating structure, the contacts connected to the conductive line,
wherein the plurality of insulating layers include a first insulating layer and a second insulating layer under the first insulating layer, the first insulating layer being in contact with the conductive line and including a recess portion for exposing an upper surface of the second insulating layer,
wherein the conductive line includes a first portion on an upper surface of the first insulating layer and a second portion on the recess portion, the first portion having a first thickness and the second portion having a second thickness, the second thickness being greater than the first thickness, and
wherein the recess portion includes regions having different widths in a second direction perpendicular to the first direction.

13. The semiconductor device of claim 12, wherein the plurality of contacts comprise first contacts spaced apart from the recess portion and second contacts at least partially overlapping the recess portion in a vertical direction, the vertical direction being perpendicular to an upper surface of the substrate.

14. The semiconductor device of claim 13, wherein the recess portion is between the first contacts in the first direction.

15. The semiconductor device of claim 13, wherein a level of a lower surface of the first contacts is lower than a level of a lower surface of the second portion of the conductive line.

16. The semiconductor device of claim 13, wherein the first portion of the conductive line is in contact with an upper surface of the first contacts.

17. The semiconductor device of claim 13, wherein the first contacts are adjacent to any one of a first side surface and a second side surface of the conductive line opposing each other.

18. The semiconductor device of claim 12, wherein the recess portion has a bent shape due to a difference in width in the second direction in a plan view.

19. A semiconductor device, comprising:
a first insulating structure on a substrate, the first insulating structure including a first etch stop layer and a first interlayer insulating layer on the first etch stop layer;
a second insulating structure on the first insulating structure, the second insulating structure including a second etch stop layer and a second interlayer insulating layer on the second etch stop layer;
a conductive line penetrating through the second insulating structure to contact the first interlayer insulating layer, the conductive line extending in a first direction parallel to an upper surface of the substrate; and
a plurality of contacts penetrating through the first insulating structure, and connected to the conductive line,
wherein the first interlayer insulating layer includes a recess portion for exposing the first etch stop layer,
wherein the conductive line includes a protrusion that is in the recess portion and is in contact with the first etch stop layer,
wherein the conductive line includes a first portion having a first thickness and being on an upper surface of the first interlayer insulating layer and a second portion having a second thickness and being between a lower surface of the protrusion and an upper surface of the conductive line,
wherein the second thickness is greater than the first thickness, and
wherein the protrusion has a first region having a first width in a second direction, perpendicular to the first direction and the protrusion has a second region having a second width in the second direction, the second width being narrower than the first width.

20. The semiconductor device of claim 19, wherein
the plurality of contacts comprise first contacts spaced apart from the recess portion and second contacts at least partially overlapping the recess portion in a vertical direction perpendicular to an upper surface of the substrate,
wherein the first contacts are adjacent to any one of a first side surface and a second side surface opposing each other of the conductive line, and
wherein in the second direction, the first contacts have a first length, and the second contacts have a second length that is longer than the first length.

* * * * *